(12) United States Patent
Kim

(10) Patent No.: US 8,530,905 B2
(45) Date of Patent: Sep. 10, 2013

(54) ORGANIC LIGHT-EMITTING DISPLAY APPARATUS

(75) Inventor: Eun-Ah Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1431 days.

(21) Appl. No.: 11/590,999

(22) Filed: Oct. 31, 2006

(65) Prior Publication Data

US 2007/0096637 A1    May 3, 2007

(30) Foreign Application Priority Data

Nov. 3, 2005    (KR) .................. 10-2005-0104926

(51) Int. Cl.
*H01L 27/15*    (2006.01)
(52) U.S. Cl.
USPC ............ 257/79; 257/40; 257/E51.002
(58) Field of Classification Search
USPC ............ 257/40, 642, E51.002, 79–103, 759; 313/503, 504
See application file for complete search history.

(56) References Cited

U.S. PATENT DOCUMENTS 7,276,453 B2 * 10/2007 Truong et al. .............. 438/739
2008/0210931 A1 * 9/2008 Truong et al. .............. 257/40

* cited by examiner

*Primary Examiner* — Matthew Landau
*Assistant Examiner* — Candice Y Chan
(74) *Attorney, Agent, or Firm* — Christie, Parker & Hale, LLP

(57) ABSTRACT

An organic light-emitting display apparatus for blocking or preventing an electrode of an organic light-emitting device from being shorted with another electrode of the organic light-emitting device at the bent portions of the electrode and for blocking or preventing impurities from penetrating into an organic layer through the bent portions. The organic light-emitting display apparatus includes: a first electrode; a pixel defining layer formed to have a thickness away from the first electrode and covering edge portions of the first electrode; a light-emitting layer on the first electrode; a second electrode on the light-emitting layer; and a stepheight lowering layer over a portion where the first electrode contacts the pixel defining layer, and between the first electrode and the light-emitting layer or between the light-emitting layer and the second electrode, to reduce a bend of the second electrode over the portion where the first electrode contacts the pixel defining layer.

22 Claims, 3 Drawing Sheets

ORGANIC LIGHT-EMITTING DISPLAY APPARATUS

CROSS-REFERENCE TO RELATED PATENT APPLICATION

This application claims priority to and the benefit of Korean Patent Application No. 10-2005-0104926, filed on Nov. 3, 2005, in the Korean Intellectual Property Office, the entire content of which is incorporated herein by reference.

BACKGROUND OF THE INVENTION

1. Field of the Invention

The present invention relates to an organic light-emitting display apparatus, and, more particularly, to an organic light-emitting display apparatus for blocking or preventing an electrode of an organic light-emitting device from being bent and shorted with another electrode of the organic light-emitting device and for blocking or preventing impurities from penetrating into an organic layer through the bent portions of the electrode.

2. Description of the Related Art

FIG. 1 is a cross-sectional view of an organic light-emitting device of a conventional organic light-emitting display apparatus.

Referring to FIG. 1, the organic light-emitting device includes a first electrode 21, a second electrode 22 facing the first electrode 21, and a plurality of organic layers 31, 32, 33, 34, and 35 formed between the first electrode 21 and the second electrode 22.

Electric signals having opposite polarities are respectively applied to the first electrode 21 and the second electrode 22. Here, the strength of an electric field is relatively high at the edge portions of the first electrode 21 or at the corner portions of the second electrode 22. Accordingly, if the edge portions of the first electrode 21 are disposed adjacent to the second electrode 22 or if the corner portions of the second electrode 22 are disposed adjacent to the first electrode 21, the organic layers 31, 32, 33, 34, and 35 between the first electrode 21 and the second electrode 22 may be damaged or destroyed due to a relatively strong electric field generated at the adjacent portions, so that the first electrode 21 may be shorted with the second electrode 22 (i.e., a short circuit or short may be generated between the first electrode 21 and the second electrode 22). Accordingly, pixel defining layers (PDLs) 10 which cover the edge portions of the first electrode 21 are formed to increase distances between the edge portions of the first electrode 21 and the second electrode 22 in order to block or prevent such a failure from occurring.

However, if the pixel defining layers 10 are formed as illustrated in FIG. 1, the organic layers 31, 32, 33, 34, and 35 formed on the upper surfaces of the first electrode 21 and the pixel defining layers 10 are bent near the boundaries of the first electrode 21 and the pixel defining layers 10. Specifically, the second electrode 22 having a polarity opposite to that of the first electrode 21 is also bent over the boundaries of the first electrode 21 and the pixel defining layers 22. Accordingly, an electric field is concentrated at the bent portions of the second electrode 22, thereby possibly causing the second electrode 22 to be shorted with the first electrode 21 as shown in FIG. 2.

Also, in the case that the organic light-emitting device is a top emission device, the second electrode 22 through which light passes is formed of a transparent or translucent electrode. Thus, if the thin second electrode 22 is bent over the boundaries of the first electrode 21 and the pixel defining layers 10, external impurities, etc., may penetrate into the organic layers 31, 32, 33, 34, and 35 between the first electrode 21 and the second electrode 22 through the bent portions, which may cause a failure of the organic light-emitting apparatus or reduces the lifespan of the organic light-emitting display apparatus.

SUMMARY OF THE INVENTION

An aspect of the present invention provides an organic light-emitting display apparatus for blocking or preventing an electrode of an organic light-emitting device from being bent and shorted with another electrode of the organic light-emitting device and for blocking or preventing impurities from penetrating into an organic layer through bent portions of an electrode.

According to an embodiment of the present invention, there is provided an organic light-emitting display apparatus including: a first electrode; a pixel defining layer formed to have a thickness away from the first electrode and covering edge portions of the first electrode; a light-emitting layer on the first electrode; a second electrode on the light-emitting layer; and a stepheight lowering layer over a portion where the first electrode contacts the pixel defining layer, and between the first electrode and the light-emitting layer or between the light-emitting layer and the second electrode, to reduce a bend of the second electrode over the portion where the first electrode contacts the pixel defining layer.

In one embodiment, a hole injection layer is between the first electrode and the second electrode, and the stepheight lowering layer is formed of substantially the same material as the hole injection layer.

In one embodiment, the hole injection layer is integrated with the stepheight lowering layer.

In one embodiment, a hole transporting layer is between the first electrode and the second electrode, and the stepheight lowering layer is formed of substantially the same material as the hole transporting layer.

In one embodiment, the hole transporting layer is integrated with the stepheight lowering layer.

In one embodiment, an electron injection layer is between the first electrode and the second electrode, and the stepheight lowering layer is formed of substantially the same material as the electron injection layer.

In one embodiment, the electron injection layer is integrated with the stepheight lowering layer.

In one embodiment, an electron transporting layer is between the first electrode and the second electrode, and the stepheight lowering layer is formed of substantially the same material as the electron transporting layer.

In one embodiment, the electron transporting layer is integrated with the stepheight lowering layer.

In one embodiment, a hole blocking layer is between the first electrode and the second electrode, and the stepheight lowering layer is formed of substantially the same material as the hole blocking layer.

In one embodiment, the hole blocking layer is integrated with the stepheight lowering layer.

In one embodiment, at least one of a hole injection layer, a hole transporting layer, an electron injection layer, and a hole blocking layer is between the first electrode and the second electrode, and the stepheight lowering layer is formed of at least one of a hole injection layer forming material, a hole transporting layer forming material, an electron injection layer forming material, an electron transporting layer forming material, or a hole blocking layer forming material.

In one embodiment, the stepheight lowering layer has an opening positioned to correspond to a center portion of the light-emitting layer.

In one embodiment, the stepheight lowering layer has a center portion positioned to correspond to a center portion of the light-emitting layer, and the center portion of the stepheight lowering layer has a thickness within a range to resonate light emitted from the light-emitting layer.

In one embodiment, the stepheight lowering layer has a center portion positioned to correspond to a center portion of the light-emitting layer, and the center portion of the stepheight lowering layer has a thickness depending on a wavelength of light emitted from the light-emitting layer.

In one embodiment, the thickness of the center portion of the stepheight lowering layer is an even multiple or an odd multiple of a half-wavelength of light emitted from the light-emitting layer.

According to another embodiment of the present invention, there is provided an organic light-emitting display apparatus including: a first electrode; a pixel defining layer formed to have a thickness away from the first electrode and covering edge portions of the first electrode; a light-emitting layer on the first electrode; a second electrode on the light-emitting layer; and an organic layer disposed between the first electrode and the light-emitting layer or between the light-emitting layer and the second electrode, wherein a portion of the organic layer over where the first electrode contacts the pixel defining layer is thicker than a portion of the organic layer corresponding to a center portion of the light-emitting layer so that a bend of the second electrode is reduced over the portion of the organic layer over where the first electrode contacts the pixel defining layer.

In one embodiment, the organic layer is at least one of a hole injection layer, a hole transporting layer, an electron injection layer, an electron transporting layer, or a hole blocking layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

Figure 1:
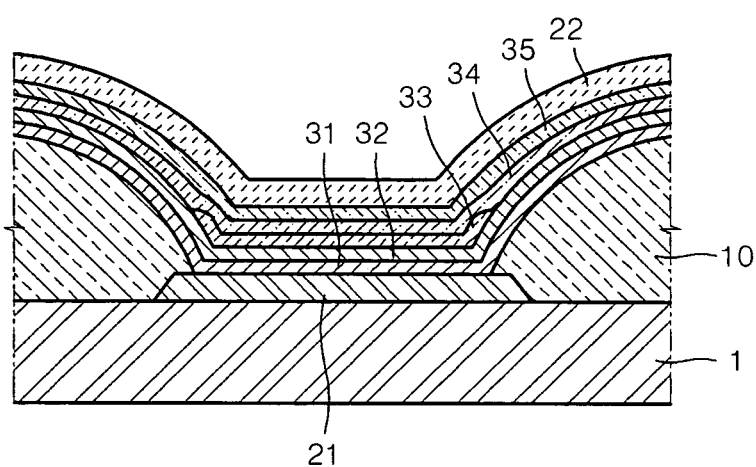
FIG. 1 is a cross-sectional view of an organic light-emitting device of a conventional organic light-emitting display apparatus.
Figure 2:
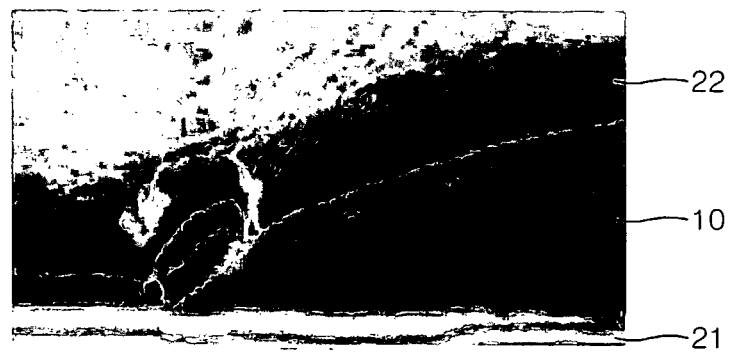
FIG. 2 is a photograph showing a phenomenon in the conventional organic light-emitting device in which an electrode is shorted with another electrode at portions where the electrode is bent.
Figure 3:
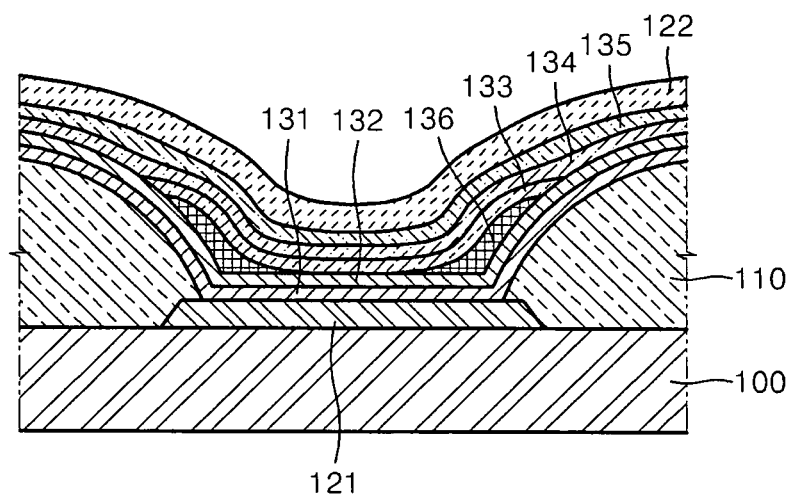
FIG. 3 is a cross-sectional view of an organic light-emitting device included in an organic light-emitting display apparatus according to a first embodiment of the present invention.

FIG. 3 is a cross-sectional view of an organic light-emitting device included in an organic light-emitting display apparatus according to a first embodiment of the present invention.

Referring to FIG. 3, the organic light-emitting device is formed on a substrate 100. Here, the substrate 100 can be formed of a variety of plastic materials such as glass, acryl, etc., and can be also formed of a metal. However, the present invention is not thereby limited, and the substrate 100 included in the organic light-emitting device according to the present embodiment can be formed of various other suitable materials.

The organic light-emitting device includes a first electrode 121, a second electrode 122 facing the first electrode 121, and one or more organic intermediate layers formed between the first electrode 121 and the second electrode 122. The one or more organic intermediate layers include at least one light-emitting layer 133 as illustrated in FIG. 3. The organic intermediate layers will be described in more detail below.

In this embodiment, the first electrode 121 functions as an anode electrode, and the second electrode 122 functions as a cathode electrode. However, the polarities of the first electrode 121 and the second electrode 122 can be reversed.

The first electrode 121 can be used as a transparent electrode or a reflective electrode. When the first electrode 121 is used as a transparent electrode, the first electrode 121 can be formed of ITO, IZO, ZnO, or $In_2O_3$. By contrast, when the first electrode 121 is used as a reflective electrode, the first electrode 121 can be formed by: (1) forming a reflective layer with Ag, Mg, Al, Pt, Pd, Au, Ni, Nd, Ir, Cr, or mixtures thereof; and (2) forming another layer with ITO, IZO, ZnO, or $In_2O_3$ on the reflective layer.

The second electrode 122 can also be used as a transparent electrode or a reflective electrode. When the second electrode 122 is used as a transparent electrode, the second electrode 122 can be formed by: (1) depositing a first layer with a transparent electrode forming material, such as ITO, IZO, ZnO, or $In_2O_3$, thereof on the organic intermediate layers applied on the first electrode 121; and (2) forming subsidiary electrode lines or bus electrode lines Li, Ca, LiF/Ca, LiF/Al, Al, Mg, or combinations thereof on the first layer (or between the organic intermediate layers and the first layer). Here, the formation of the subsidiary electrode lines or bus electrode lines may be made before the deposition of the first layer. By contrast, when the second electrode 122 is used as a reflective electrode, the second electrode 122 can be formed by depositing (or only depositing) the above-mentioned Li, Ca, LiF/Ca, Li/Al, Al, Mg, or combinations thereof on the organic intermediate layers.

Also, pixel defining layers (PDLs) 110 are formed with a certain or predetermined thickness away from the first electrode 121 in a manner that covers the edge portions of the first electrode 121. The pixel defining layers 110 define light-emitting areas and increase distances between the edge portions of the first electrode 121 and the second electrode 122, thereby blocking or preventing an electric field from being concentrated at the edge portions of the first electrode 121 and thus blocking or preventing the first electrode 121 from being shorted with the second electrode 122.

Between the first electrode 121 and the second electrode 122, a variety of organic layers including at least one light-emitting layer 133 are formed. The organic layers can be formed of low molecular organics or polymer organics.

In the organic light-emitting device illustrated in FIG. 3, the organic layers formed between the first electrode 121 and the second electrode 122 are formed of low molecular organics. Here, when the first electrode 121 functions as an anode electrode as illustrated in FIG. 3, a hole injection layer (HIL) 131, a hole transporting layer (HTL) 132, a light-emitting layer (EML) 133, an electron transporting layer (ETL) 134, and an electron injection layer (EIL) 135 can be formed in the order as shown (or listed), from the first electrode 121 through to the second electrode 122. These organic layers can be formed of copper phthalocyanine (CuPc), N,N'-di(naphthalene-1-yl)- N, N'-diphenyle-benzidine (NPB), tris-8-hydroxyquinoline aluminum (Alq3), etc. These low molecular organics can be formed by vacuum deposition using masks.

In one embodiment, all of the above-mentioned organic layers 131, 132, 133, 134, and 135 do not need to be formed. In only embodiment, only some of the organic layers 131, 132, 133, 134, and 135 are selectively formed. Also, although not illustrated in FIG. 3, a hole blocking layer (HBL) can be further formed between the EML 133 and the ETL 134. Also, one or more other suitable organic layers can be formed with or between the organic layers. Also, when the first electrode 121 functions as a cathode electrode and the second electrode 122 functions as an anode electrode, the above arrangement of the organic layers 131, 132, 133, 134, and 135 can vary.

If the organic layers between the first electrode 121 and the second electrode 122 are formed of polymer organics, the organic layers can be composed of a hole transporting layer and a light-emitting layer. Here, the hole transporting layer is formed of PEDOT (Poly-3,4-Ethylenedioxythiophene), and the light-emitting layer is formed of polymer organics, such as Poly-Phenylenvinylene (PPV) and Polyfluorene.

Figure 4:
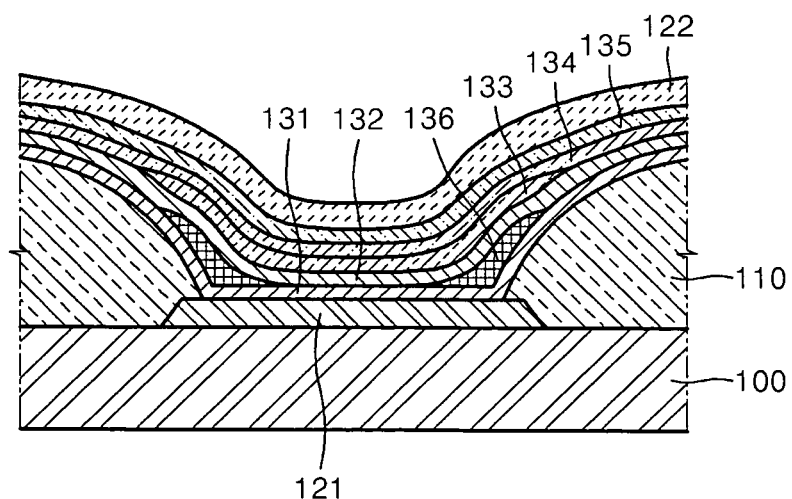
FIG. 4 is a cross-sectional view of an organic light-emitting device included in an organic light-emitting display apparatus according to a second embodiment of the present invention.

Also, a stepheight lowering layer 136 is formed between the first electrode 121 and the light-emitting layer 133. In the first embodiment as illustrated in FIG. 3, the stepheight lowering layer 136 is formed between the hole transporting layer 132 and the light-emitting layer 133; however, the present invention is not limited to this. As in an organic light-emitting device according to a second embodiment of the present invention, as illustrated in FIG. 4, the stepheight lowering layer 136 can be formed between the hole injection layer 131 and the hole transporting layer 132a. The stepheight lowering layer 136 can also be formed between the first electrode 121 and the hole injection layer 131. Also, if different layers are additionally formed between the organic layers, the stepheight lowering layer 136 can be formed between (or with) these layers. It is also possible that the stepheight lowering layer 136 is formed between the light-emitting layer 133 and the second electrode 122. Also, the stepheight lowering layer 136 can be formed between various organic layers formed between the light-emitting layer 133 and the second electrode 122.

The stepheight lowering layer 136 has an opening positioned to correspond to the center portion of the light-emitting layer 133, as illustrated in FIGS. 3 and 4, and is disposed over the first electrode 121 and the pixel defining layer 110, thereby reducing the bend of the second electrode 122 over portions where the first electrode 121 contacts the pixel defining layers 110. Thus, the second electrode 122 is bent less (or smoothly bent without a sharp edge), so that the electric field concentration at the bent portions is reduced. Accordingly, embodiments of the present invention can block or prevent the first electrode 121 from being shorted with the second electrode 122. Also, in the case that the organic light-emitting device is a top emission device in which light is emitted to the outside through the second electrode 122, because the second electrode 122 is bent less over portions where the first electrode 121 contacts the pixel defining layers 110 (even if the second electrode 122 is thin), embodiments of the present invention can block or prevent external impurities, etc., from penetrating into the organic layers 131, 132, 133, 134, and 135 between the first electrode 121 and the second electrode 122 through the bent portions.

The stepheight lowering layer 136 can be formed of a variety of materials. For example, the stepheight lowering layer 136 can be formed of the same material as an organic layer formed between the first electrode 121 and the second electrode 122. That is, if a hole injection layer is formed between the first electrode 121 and the second electrode 122, the stepheight lowering layer 136 can be formed of the same material as the hole injection layer. If a hole transporting layer is formed between the first electrode 121 and the second electrode 122, the stepheight lowering layer 136 can be formed of the same material as the hole transporting layer. Also, if a hole blocking layer is formed between the first electrode 121 and the second electrode 122, the stepheight lowering layer 136 can be formed of the same material as the hole blocking layer. If an electron transporting layer is formed between the first electrode 121 and the second electrode 122, the stepheight lowering layer 136 can be formed of the same material as the electron transporting layer. Likewise, if an electron injection layer is formed between the first electrode 121 and the second electrode 122, the stepheight lowering layer 136, can be formed of the same material as the electron injection layer. That is, the stepheight lowering layer 136 can be formed of at least one of a hole injection layer forming material, a hole transporting layer forming material, an electron injection layer forming material, an electron transporting layer forming material, or a hole blocking layer forming material. In addition, the stepheight lowering layer 136 may be formed of one or more other suitable materials which do not block the light passing between the first electrode 121 and the second electrode 122.

Figure 5:
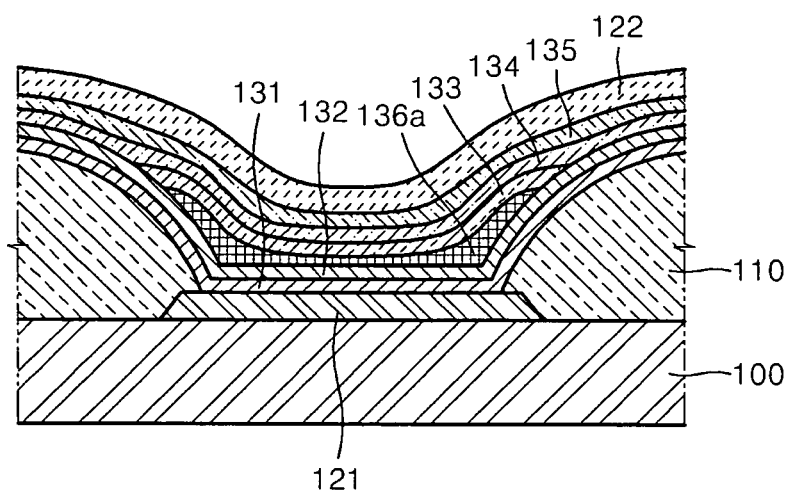
FIG. 5 is a cross-sectional view of an organic light-emitting device included in an organic light-emitting display apparatus according to a third embodiment of the present invention.

FIG. 5 is a cross-sectional view of an organic light-emitting device included in an organic light-emitting display apparatus according to a third embodiment of the present invention.

The organic light-emitting device according to the third embodiment of the present invention is different from the organic light-emitting devices according to the above-described first and second embodiments, in that a stepheight lowering layer 136a has a certain portion (and not an opening) that is formed to correspond to the center portion of a light-emitting layer 133. Here, the thickness of the center portion of the stepheight lowering layer 136a is within a range (or a predetermined range) that can resonate light emitted from the light-emitting layer 133. The light-emitting layer 133 can be a light-emitting layer that emits different wavelengths of light. In order to generate light resonance with respect to the different wavelengths of light, the center portion of the stepheight lowering layer 136a can have the same thickness regardless of the wavelengths of light emitted from the light-emitting layer 133. For example, if light emitted from the light-emitting layer 133 is red, green, and blue light, the center portion of the stepheight lowering layer 136 can have a thickness corresponding to a least common multiple of a minimum thickness value capable of resonating the red light, a minimum thickness value capable of resonating the green light, and a minimum thickness value capable of resonating the blue light.

In one embodiment, the thickness of the center portion of the stepheight lowering layer 136 depends on a wavelength of light emitted from the light-emitting layer 133. In this embodiment, the thickness of the center portion of the stepheight lowering layer 136 can be an even multiple or an odd multiple of a half-wavelength of light emitted from the light-emitting layer 133. Determination of whether the thickness of the center portion of the stepheight lowering layer 136 is an even multiple or an odd multiple of a half-wavelength of light emitted from the light-emitting layer 133, depends on whether an index of refraction of the stepheight lowering layer 136 is greater or smaller than indices of refraction of the upper and lower layers of the stepheight lowering layer 136. This is because a phase of light varies according to whether the index of refraction of the stepheight lowering layer 136 is greater or smaller than the indices of refraction of the upper and lower layers of the stepheight lowering layer 136, and accordingly a condition causing a constructive interference in the stepheight lowering layer 136 varies.

According to the organic light-emitting device structures as described above, the bend of the second electrode 122 over the portions where the first electrode 121 contacts the pixel defining layers 110 can be reduced, thereby preventing defects from being generated in the organic light-emitting device, enhancing a yield of the organic light-emitting device, increasing a lifespan of the organic light-emitting device, and improving a brightness characteristic of the organic light-emitting device.

Figure 6:
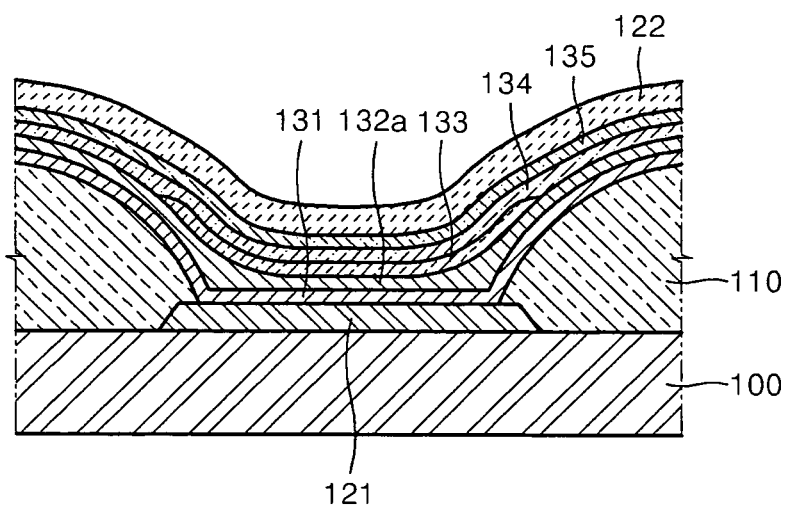
FIG. 6 is a cross-sectional view of an organic light-emitting device included in an organic light-emitting display apparatus according to a fourth embodiment of the present invention.

FIG. 6 is a cross-sectional view of an organic light-emitting device included in an organic light-emitting display apparatus according to a fourth embodiment of the present invention.

The organic light-emitting device according to the fourth embodiment is different from the organic light-emitting devices according to the above-described embodiments, in that an organic layer (e.g., layer 132*a*) formed between a first electrode 121 and a second electrode 122 is used to reduce the bend of the second electrode 122 without separately forming a stepheight lowering layer.

That is, by forming a portion (a part over a portion where the first electrode 121 contacts pixel defining layers 110) of at least one organic layer (e.g., layer 132*a* in FIG. 6) of the organic layers formed between the first electrode 121 and the second electrode 122 to be thicker than the remaining portion of the at least one organic layer (e.g., layer 132*a*) corresponding to the center portion of a light-emitting layer 133, the bend of the second electrode 122 over the portions where the first electrode 121 contacts the pixel defining layers 110 can be less (or lowered). The at least one organic layer may be one of a hole injection layer, a hole transporting layer, an electron injection layer, an electron transporting layer, and a hole blocking layer. Specifically, as shown in FIG. 6, a hole injection layer 131, a hole transporting layer 132*a*, an electron injection layer 134, and an electron transporting layer 135 are formed between the first electrode 121 and the second electrode 122, and the thickness of the hole transporting layer 132*a* is varied (or adjusted) in order to lower the bend of the second electrode 122.

In the organic light-emitting device according to the fourth embodiment, a stepheight lowering layer function (e.g. a function of the layer 136 of the first embodiment illustrated in FIG. 3) is integrated with the layer 132*a* as a single layer.

As described above, in an organic light-emitting display apparatus according to an embodiment of the present invention, the following effects can be obtained.

First, by blocking or preventing a second electrode from being sharply bent over portions where a first electrode contacts pixel defining layers, the embodiment can block or prevent an electric field from being concentrated at specific portions (or bent portions) of the second electrode to thus block or prevent the first electrode from being shorted with the second electrode.

Second, by blocking or preventing the second electrode from being sharply bent over portions where the first electrode contacts pixel defining layers, it is possible to block or prevent external impurities, etc., from penetrating into an organic layer formed between the first electrode and the second electrode through the bent portions of the second electrode.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. An organic light-emitting display apparatus comprising:
   a first electrode;
   a pixel defining layer formed to have a thickness away from the first electrode and covering edge portions of the first electrode;
   a light-emitting layer on the first electrode;
   a second electrode on the light-emitting layer;
   a stepheight lowering layer over a portion where the first electrode contacts the pixel defining layer, and between the first electrode and the light-emitting layer or between the light-emitting layer and the second electrode, the stepheight lowering layer being configured to eliminate a formation of a sharp edge of the second electrode over the portion where the first electrode contacts the pixel defining layer; and
   a hole transporting layer between the first electrode and the second electrode, wherein the stepheight lowering layer is a distinct layer from the hole transporting layer.

2. The organic light-emitting display apparatus of claim 1, wherein a hole injection layer is between the first electrode and the second electrode, and the stepheight lowering layer is formed of substantially the same material as the hole injection layer.

3. The organic light-emitting display apparatus of claim 2, wherein the hole injection layer is integrated with the stepheight lowering layer.

4. The organic light-emitting display apparatus of claim 1, wherein the stepheight lowering layer is founed of substantially the same material as the hole transporting layer.

5. The organic light-emitting display apparatus of claim 1, wherein an electron injection layer is between the first electrode and the second electrode, and the stepheight lowering layer is formed of substantially the same material as the electron injection layer.

6. The organic light-emitting display apparatus of claim 5, wherein the electron injection layer is integrated with the stepheight lowering layer.

7. The organic light-emitting display apparatus of claim 1, wherein an electron transporting layer is between the first electrode and the second electrode, and the stepheight lowering layer is formed of substantially the same material as the electron transporting layer.

8. The organic light-emitting display apparatus of claim 7, wherein the electron transporting layer is integrated with the stepheight lowering layer.

9. The organic light-emitting display apparatus of claim 1, wherein a hole blocking layer is between the first electrode and the second electrode, and the stepheight lowering layer is formed of substantially the same material as the hole blocking layer.

10. The organic light-emitting display apparatus of claim 9, wherein the hole blocking layer is integrated with the stepheight lowering layer.

11. The organic light-emitting display apparatus of claim 1, wherein at least one of a hole injection layer, an electron injection layer, or a hole blocking layer is between the first electrode and the second electrode, and the stepheight lowering layer is formed of at least one of a hole injection layer forming material, a hole transporting layer forming material, an electron injection layer forming material, an electron transporting layer forming material, or a hole blocking layer forming material.

12. The organic light-emitting display apparatus of claim 1, wherein the stepheight lowering layer has an opening positioned to allow a direct connection between the hole transporting layer and the light-emitting layer or between a hole injection layer and the hole transporting layer in a position corresponding to a center portion of the light-emitting layer.

13. The organic light-emitting display apparatus of claim 1, wherein the stepheight lowering layer has a center portion positioned to correspond to a center portion of the light-emitting layer, and the center portion of the stepheight lowering layer has a thickness within a range to resonate light emitted from the light-emitting layer.

14. The organic light-emitting display apparatus of claim 1, wherein the stepheight lowering layer has a center portion positioned to correspond to a center portion of the light-emitting layer, and the center portion of the stepheight lowering layer has a thickness depending on a wavelength of light emitted from the light-emitting layer.

15. The organic light-emitting display apparatus of claim 14, wherein the thickness of the center portion of the stepheight lowering layer is an even multiple or an odd multiple of a half-wavelength of light emitted from the light-emitting layer.

16. The organic light-emitting display apparatus of claim 1, wherein the stepheight lowering layer is a separate layer between an organic layer on the first electrode and the light-emitting layer or between the light-emitting layer and the second electrode.

17. An organic light-emitting display apparatus comprising:
a first electrode;
a pixel defining layer formed to have a thickness away from the first electrode and covering edge portions of the first electrode;
a light-emitting layer on the first electrode;
a second electrode on the light-emitting layer;
an organic layer disposed between the first electrode and the light-emitting layer or between the light-emitting layer and the second electrode, wherein a portion of the organic layer over where the first electrode contacts the pixel defining layer is thicker than a portion of the organic layer corresponding to a center portion of the light-emitting layer, the portion of the organic layer over where the first electrode contacts the pixel defining layer being configured to eliminate a formation of a sharp edge of the second electrode over the portion of the organic layer over where the first electrode contacts the pixel defining layer; and
a hole transporting layer between the first electrode and the second electrode, wherein the organic layer is a distinct layer from the hole transporting layer.

18. The organic light-emitting display apparatus of claim 17, wherein the organic layer is at least one of a hole injection layer, an electron injection layer, an electron transporting layer, or a hole blocking layer.

19. The organic light-emitting display apparatus of claim 17, wherein the organic layer is a first organic layer disposed between a second organic layer on the first electrode and the light-emitting layer or between the light-emitting layer and the second electrode.

20. An organic light-emitting display apparatus comprising:
a first electrode;
a pixel defining layer formed to have a thickness away from the first electrode and covering edge portions of the first electrode;
a light-emitting layer on the first electrode;
a second electrode on the light-emitting layer;
a stepheight lowering layer over a portion where the first electrode contacts the pixel defining layer, and between the first electrode and the second electrode, the stepheight lowering layer being configured to eliminate a formation of a sharp edge of the second electrode over the portion where the first electrode contacts the pixel defining layer; and
a hole transporting layer between the first electrode and the second electrode, wherein the stepheight lowering layer is a distinct layer from the hole transporting layer.

21. The organic light-emitting display apparatus of claim 20, wherein at least one of a hole injection layer, an electron injection layer, an electron transporting layer or a hole blocking layer is between the first electrode and the second electrode, and the stepheight lowering layer is formed of at least one of a hole injection layer forming material, a hole transporting layer forming material, an electron injection layer forming material, an electron transporting layer forming material, or a hole blocking layer forming material.

22. The organic light-emitting display apparatus of claim 20, wherein the stepheight lowering layer is a separate layer between at least one of a hole injection layer, an electron injection layer, an the electron transporting layer or a hole blocking layer on the first electrode and the second electrode.

* * * * *

UNITED STATES PATENT AND TRADEMARK OFFICE
CERTIFICATE OF CORRECTION

PATENT NO.        : 8,530,905 B2
APPLICATION NO.   : 11/590999
DATED             : September 10, 2013
INVENTOR(S)       : Eun-Ah Kim et al.

Page 1 of 1

It is certified that error appears in the above-identified patent and that said Letters Patent is hereby corrected as shown below:

In the Claims

| | |
|---|---|
| Col. 8, line 45, Claim 4 | Delete "founed", Insert --formed-- |
| Col. 10, line 50, Claim 20 | Delete "an the electron", Insert --an electron-- |

Signed and Sealed this

Thirteenth Day of January, 2015

Michelle K. Lee
*Deputy Director of the United States Patent and Trademark Office*